United States Patent [19]

Nagasaka et al.

[11] Patent Number: 5,290,375
[45] Date of Patent: Mar. 1, 1994

[54] PROCESS FOR MANUFACTURING CERAMIC MULTILAYER SUBSTRATE

[75] Inventors: Takashi Nagasaka; Hideki Nakagawara, both of Anjyo, Japan

[73] Assignee: Nippondenso Co., Ltd., Kariya, Japan

[21] Appl. No.: 7,020

[22] Filed: Jan. 21, 1993

Related U.S. Application Data

[63] Continuation of Ser. No. 562,590, Aug. 3, 1990, abandoned.

[30] Foreign Application Priority Data

Aug. 5, 1989 [JP] Japan .................. 1-203642

[51] Int. Cl.⁵ ............................ B32B 18/00
[52] U.S. Cl. ........................ 156/89; 427/96; 427/126.2; 427/314; 427/376.1; 427/380; 427/419.1
[58] Field of Search ............. 156/89; 264/61; 427/126.2, 96, 314, 376.1, 380, 419.1

[56] References Cited

U.S. PATENT DOCUMENTS 4,861,646  8/1989  Barringer et al. ............ 428/210
4,880,684 12/1989  Boss et al. .................. 428/209

FOREIGN PATENT DOCUMENTS 61-59798   3/1986  Japan .
61-170093  7/1986  Japan .
63-215559  9/1988  Japan .

OTHER PUBLICATIONS

IBM Technical Disclosure Bulletin, Ceramic Surface Preparation, vol. 16, No. 2, Jul. 1973.

*Primary Examiner*—Jan H. Silbaugh
*Assistant Examiner*—Christopher A. Fiorilla
*Attorney, Agent, or Firm*—Cushman, Darby & Cushman

[57] ABSTRACT

A ceramic multilayer substrate, containing a stack of alternate ceramic and inner conductor layers, the conductor layer having a melting point higher than a lowest firing temperature of the ceramic layer, the stack having a top ceramic layer, and a conductor layer formed on the stack, the conductor layer being electrically connected to the inner conductor layer, is characterized by further including an insulating layer formed on the top ceramic layer of the stack and under the insulating layer, the insulating layer having a firing temperature lower than the lowest firing temperature of the ceramic layer.

11 Claims, 5 Drawing Sheets

5,290,375

PROCESS FOR MANUFACTURING CERAMIC MULTILAYER SUBSTRATE

This is a continuation of application Ser. No. 07/562,590, filed on Aug. 3, 1990, which was abandoned upon the filling hereof.

BACKGROUND OF THE INVENTION

1. Field of the Invention

The present invention relates to a multi-layer ceramic substrate, more specifically, to a multi-layer ceramic substrate manufactured by laminate ceramic layers and metal layers one upon the other, firing the laminate, and then forming a conducting layer on the fired laminate, and a process for manufacturing such a multi-layer ceramic substrate.

2. Description of the Related Art

Various methods of manufacturing a multi-layer ceramic substrate have been developed, and the green sheet method is most often used because of its suitability when increasing the number of layers. The green sheet method is classified into two groups, a printing method and a tape method, in which the printing method is used in a condenser-including circuit substrate or the like, because the thickness of the ceramic layer is thinner than that of the tape method, and thus the parasitic capacity is larger.

In the printing method, for example, three alumina paste layers and a metal paste layer are alternately laminated by printing, the stack having three alumina paste layers on top, and the laminate is then fired. After the firing, a top conducting metal layer is formed on the top alumina layer (the three alumina paste layers become an alumina layer after firing) by a printing method (thick film forming method). The inventors found that, if the alumina paste layers printed on the top of the laminate contain contaminations such as dust, squeegee, rubber, powder, the contaminations are also fired to form defects such as pin holes in the top alumina layer. These defects may cause a short circuit between the inner metal layer in the laminate and the top conducting metal layer formed later on the top alumina layer by the printing method and thus the reliability of the insulation of this multi-layer substrate is lowered.

A similar problem occurs when the green sheet method is adopted. In the green sheet method, since the thickness of a ceramic layer is thick, typically about 100 microns, a short circuit is not easily formed by a defect formed in the ceramic layer, but there are cases wherein the thickness of the ceramic layer is thinner and large defects may be formed by contaminations in the green sheet or an extraordinary grain growth may occur, and thus a short circuit may be formed due to these defects.

The object of the present invention is to solve the above problem and increase the reliability of the insulation of a multi-layer ceramic substrate.

SUMMARY OF THE INVENTION

The above and other objects are attained by a ceramic multi-layer substrate comprising a laminate of alternate ceramic and inner conductor layers, the conductor layer having a melting point higher than a lowest firing temperature of the ceramic layer, and the laminate having a top ceramic layer; an insulating layer formed on the top ceramic layer of the laminate, the insulating layer having a firing temperature lower than the lowest firing temperature of the ceramic layer; and a conductor layer on the insulating layer, the conductor layer being electrically connected to the inner conductor layer.

There is also provided a process for manufacturing a ceramic multi-layer substrate, comprising the steps of forming and firing a laminate of alternate ceramic and inner conductor layers at a temperature lower than a melting point of the inner conductor layers, the laminate having a top ceramic layer, forming and firing an insulating layer on the top ceramic layer at firing temperature lower than a lowest firing temperature of the ceramic layer, and forming a conductor layer on the insulating layer, the conductor layer being electrically connected to the inner conductor layer.

In the present invention, even if defects such as pin holes are formed in the top ceramic layer during the firing of the laminate of alternate ceramic and metal conductor layers, such defects are buried by, or filled with, or recovered by the insulating layer formed on the top ceramic layer. Accordingly, the conductor layer formed on the insulating layer and the metal layer in the laminate are completely insulated, whereby the reliability of the insulation is improved.

DESCRIPTION OF THE PREFERRED EMBODIMENTS

Figure 1:
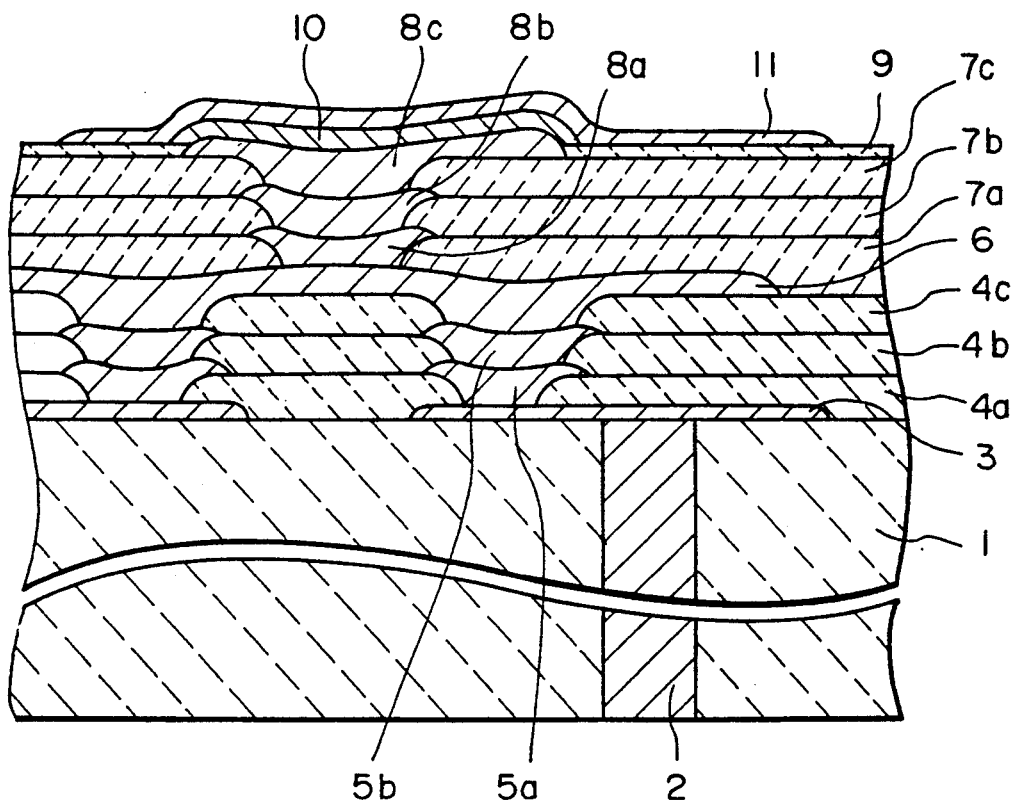
FIG. 1 is a sectional view of a ceramic multi-layer substrate according to the present invention.

FIG. 1 illustrates a sectional structure of an embodiment of the present invention. In the figure, 1 denotes an alumina tape having through holes 2 in which a refractory metal such as W(tungsten) or Mo (molybdenum) is filled. An inner conductor layer 3 made of a refractory metal is formed on the alumina tape 1, and an alumina printed layer 4a is formed on the inner conductor layer 3; the alumina printed layer 4a having openings whereby a portion of the inner conductor layer 3 is exposed. Via-fill conductor layers 5a made of a refractory metal are formed the openings, and are electrically connected to the inner conductor layer 3. In the same way, an alumina printed layer 4b, via-fill conductor layers 5b, and an alumina printed layer 4c are successively formed on the above alumina printed layer 4a and via-fill conductor layer 5a. Further, an inner conductor layer 6 is formed thereon in the required pattern, and an alumina printed layer 7a, a via-fill conductor layer 8a, an alumina printed layer 7b, a via-fill conductor layer 8b, an alumina printed layer 7c, and a via-fill conductor layer 8c are successively formed or laminated thereon. Further a glass printed layer 9 is formed on the top alumina printed layer, according to the present invention. To ensure the electrical connection between the top via-fill conductor layer 8c and a thick film conductor layer 11, a connection assist layer 10 is formed on the via-fill conductor layer 8c by plating a metal such as Ni, Cu or Au or by an organic metal, etc. Finally, the thick film conductor layer 11 made of Cu, Ni, Ag, Au or the like is formed on the connection assisit layer 10 and the glass printed layer 9 and the thick film conductor layer 11 are electrically connected to the connection assist layer 10, Accordingly, a ceramic multi-layer substrate according to the present invention is constructed, and various chips, etc., can be mounted on the thick film conductor layer 11 of this substrate.

Figure 2:
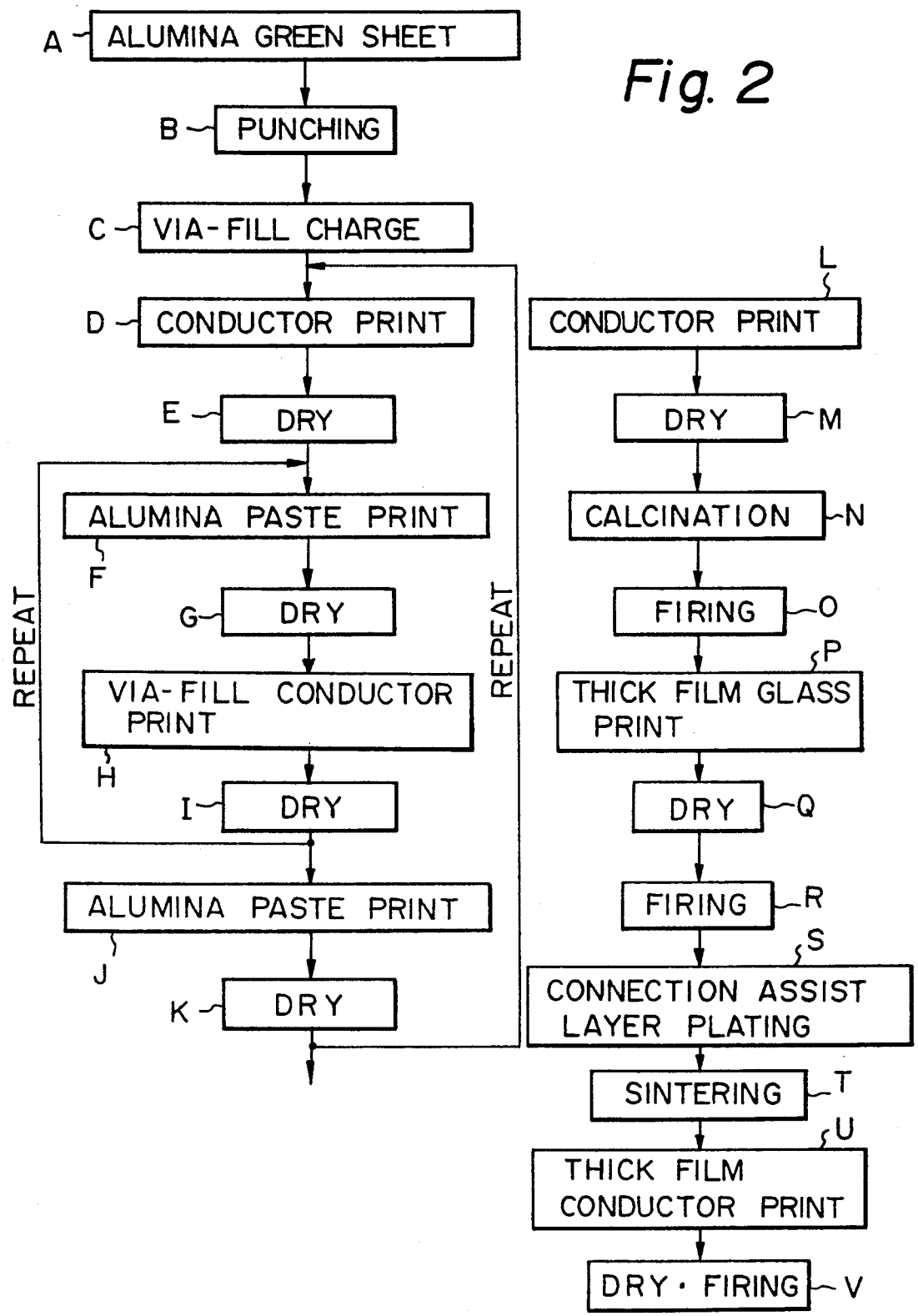
FIG. 2 is a flow chart of a process of manufacturing a ceramic multi-layer substrate according to the present intention.

The process of manufacturing the above ceramic multi-layer substrte is described in detail with reference to the flow chart shown in FIG. 2.

First, an alumina green sheet tape to be formed into the alumina tape 1 is prepared (step A) and is punched to form through holes 2 (step B), the through holes 2 are filled with a refractory metal by pressing or printing (step C), and refractory metal paste layer forming the inner conductor layer 3 is formed on the tape by a screen printing (step D) and dried at 110° C. to 150° C. (step E). An alumina paste layer forming the alumina printed layer 4a is formed on the inner conductor layer 3 and the tape (step F) and dried (step G) and a via-fill conductor paste layer forming the via-fill conductor layer 5a is printed at the openings of the alumina past layer (step H) and dried (step I). The steps F to I are repeated (once in this example) to form an alumina paste layer and a via-fill conductor paste layer, which form the alumina printed layer 4b and the via-fill conductor layer 5b, respectively. Further, an alumina paste layer forming the alumina printed layer 4c is printed thereon (step J) and dried (step K). The successive steps D to K form one interconnecting or wiring layer, and thus a multi-layer structure may be formed, if necessary by repeating these steps. In this example, the steps D to K are repeated once, and conductor paste layers and alumina paste layers, forming the inner conductor layer 6, alumina printed layer 7a, via-fill conductor layer 8a, alumina printed layer 7b, via-fill conductor layer 8b, and alumina printed layer 7c, are thereby formed.

A refractory metal paste layer forming the via-fill conductor layer 8c is printed (step L) and dried (step M), and the thus-obtained substrate is calcined at about 350° C. for 16 hours (step N), and then fired at 1600° C. in an atmosphere of $N_2+H_2+H_2O$ for 24 hours (step O). Note, the melting point of the refractory metal used for the inner conductor layers 3 and 6 and the via-fill conductor layers 5a, 5b, 8a, 8b, nd 8c must be higher than the lowest firing temperature of the alumina layers.

A thick film glass layer forming the glass printed layer 9 is formed entirely over the alumina printed layer 7c, except on the exposed via-fill conductor layer 8c, by printing (step P), dried at 125°-150° C. (step Q), and then fired in the air or an $N_2$ atmosphere at 850°-900° C. for 1 hour (step R). The term "thick film" or "thick film forming method" suggests a film formed by printing a paste and firing same, or a method thereof. The material of the thick film glass layer may comprise a glass normaly used for a glass interlayer, and the thick film glass layer may be formed by printing a paste comprising glass components, a metal oxide as a glass crystal seed, and fillers such as ceramic fillers, dispersed in an organic soluvent. If necessary, steps P and Q may be repeated to form a number of glass printed layers 9.

Ni, Cu or Au is the plated on the via-fill conductor layer 8c (step S) and the plated layer is sinterd (step T) to form the connection assist layer 10. The sintering step may be eliminated, or the connection assist layer 10 may be formed by printing a paste of Pt, etc., and firing the same at 850°-900° C.

Figure 3A:
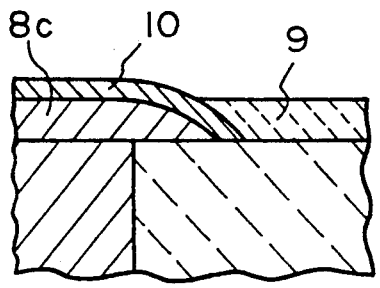
FIGS. 3A and 3B are sectional views of a portion of a ceramic multi-layer substrate.
Figure 3B:
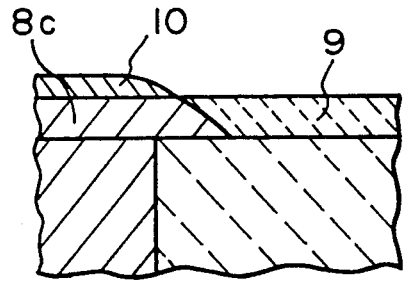

Alternatively, the steps P to Q for forming the thick film glass layer 9 and the steps S and T for forming the connection assist layer 10 may be reversed, and similar effects obtained. This is advantageous because, as shown in FIG. 3A, since the underlying via-fill conductor later 8c is completely covered by the connection assist layer 10 before the thick film glass layer 9 is formed, the via-fill conductor layer 8c, which is easily oxidized, is protected by the connection assist layer 10. As shown in FIG. 3B, if the thick film glass layer 9 is formed before the connection assist layer 10, the via-fill conductor layer 8c may be adversely affected by oxidation through a thin portion (a defect is easily formed) of the thick film glass layer 9.

If the next step of firing a thick film conductor layer 11 (step V) is carried out in the air, the underlying via-fill conductor layer 8c made of a metal sensitive to oxidation, such as W, Mo, etc., may be adversely affected by the oxidation. To prevent this oxidation, a connection assist layer 10 should be formed before forming the thick film glass layer 9, and the connection assist layer 10 must be resistant to oxidation. The oxidation resistant connection assist layer may be made, for example, by forming a noble metal layer after plating the surface of the via-fill conductor layer 8c.

A thick film conductor paste layer comprising a Cu, Ni, Ag or Au-based material is formed on the connection assist layer 10 and the glass printed layer 9 by printing (step U), dried, and fired in the air or an $N_2$ atmosphere at about 850° C. for 1 hour (step V), whereby the ceramic multi-layer substrate is manufactured.

In the above example of the present invention, the respective layers formed up to the step M are simultaneously fired at steps N and O, and the glass printed layer 9 is then formed by firing. Accordingly, even if defects such as pin holes are formed in the alumina layers 7a, 7b, and 7c during the firing step, the defects are buried by the glass printed layer 9 during the firing of the glass printed layer 9, whereby short circuits, formed from the beginning, during use, or in the durability test, between the upper and lower conductor layers through the defects are prevented.

Figure 4:
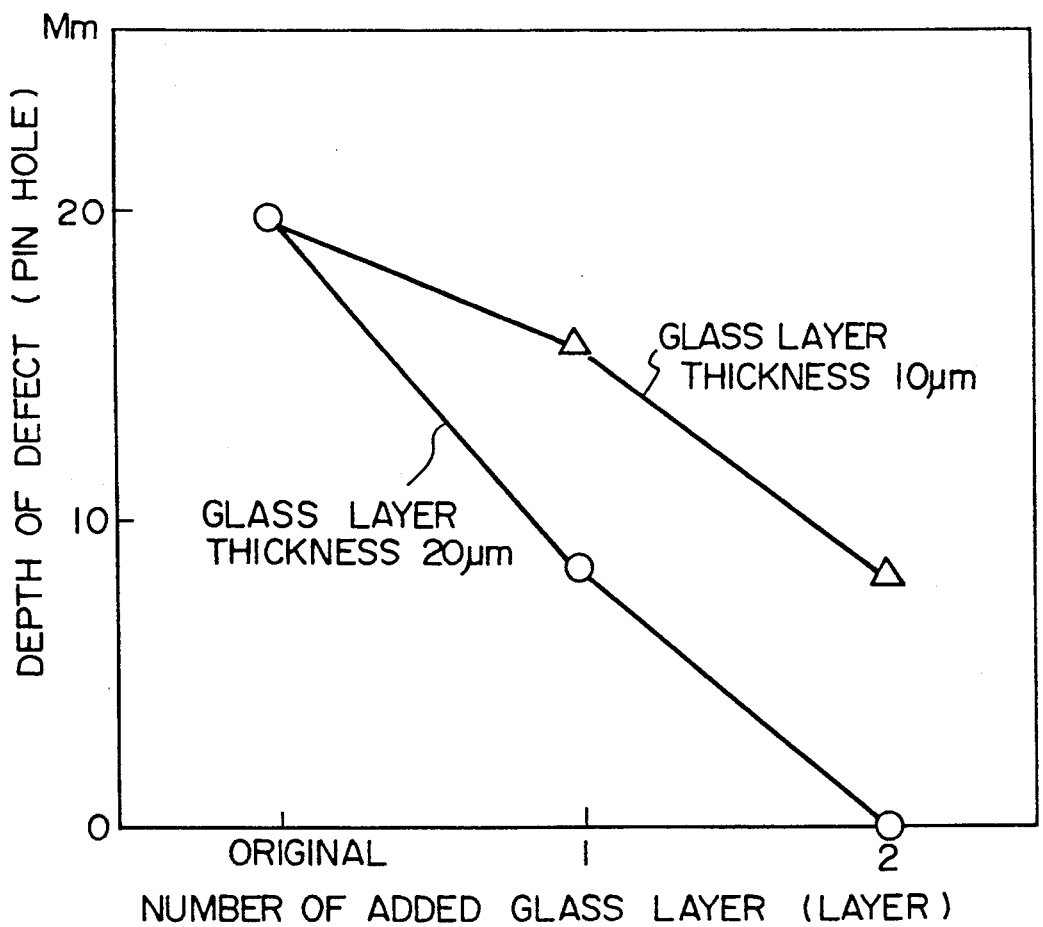
FIG. 4 shows the relationships between the depth of a defect and the number of added glass layers.

FIG. 4 shows a relationship between the number of glass printed layers 9 on the alumina printed layer 7c and the depth of the defect (pin hole). The evaluation was made by preliminarily forming a defect (pin hole) having a diameter of 100 μm and a depth of 20 μm in the alumina printed layer 7c, and then forming the glass printed layers 9 thereon by printing and firing. In FIG. 4, the circle marks indicate a thickness of the alumina printed layer 7c of 20 μm and the triangle marks indicate that of 10 μm. It is clearly seen from FIG. 4 that the effect of the glass printed layers 9 is remarkable, and that the effect is increased by an increase of the number of the glass printed layers 9. Particularly, when the thickness of the glass printed layer 9 is made 20 μm, and two glass printed layers 9 are formed, a pin hole having a diameter as large as 100 μm can be alomost completely buried.

Figure 5A:
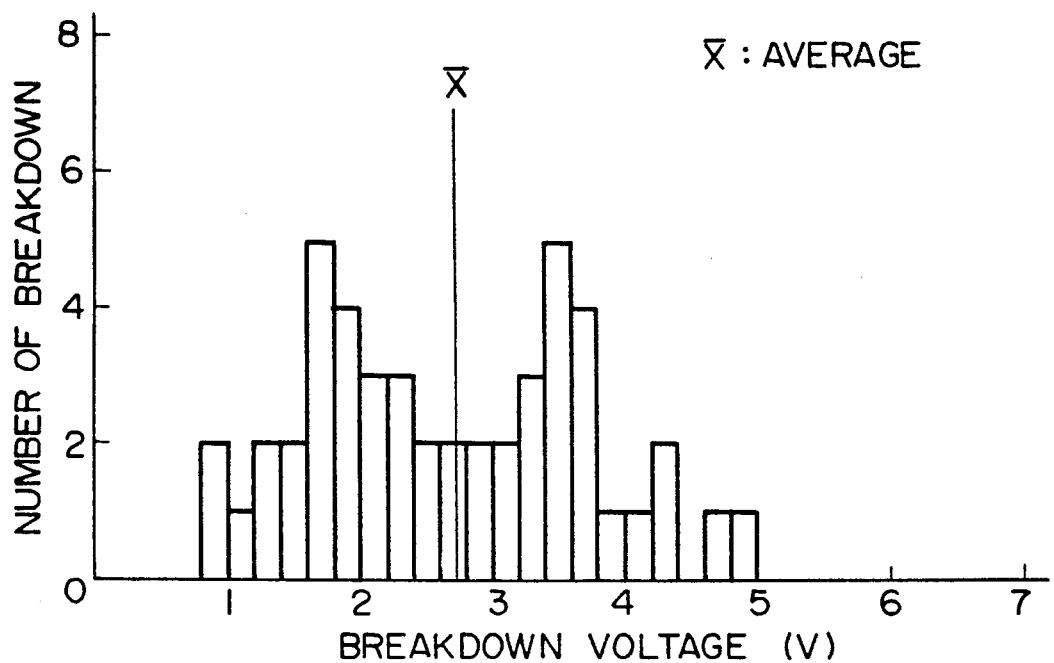
FIGS. 5A and 5B shone a relationship between the number of breakdowns and the breakdown voltage.
Figure 5B:
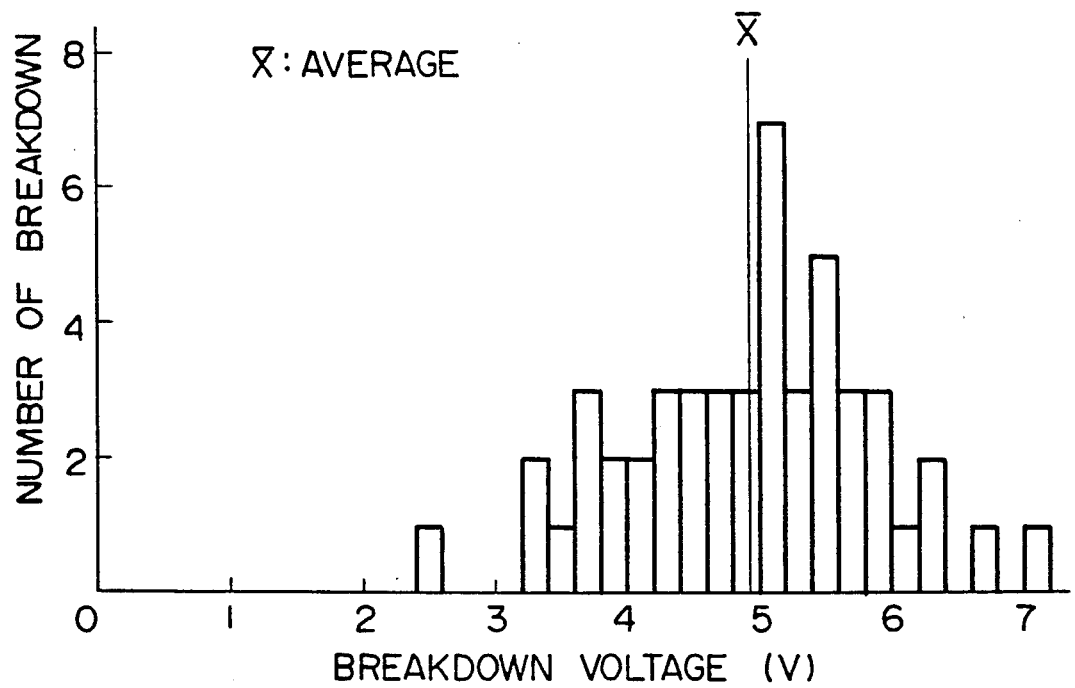

FIGS. 5A and 5B show a relationship between the number of breakdowns (insulation breakage) and the breakdown voltage; FIG. 5A showing the case when the glass printed layer 9 is not formed, and FIG. 5B showing the case when a glass printed layer 9 having a thickness of 17 μm is formed. In FIGS. 5A and 5B, "x" indicates the average breakdown voltage. It is seen from the comparison between FIGS. 5A and 5B that the breakdown voltage is generally shifted to a higher valtage by the formation of the glass printed layer 9.

Figure 6:
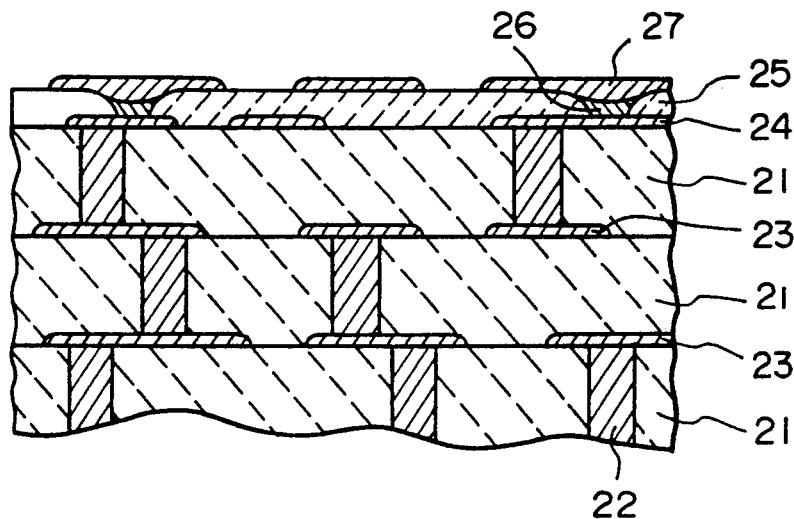
FIGS. 6 and 7 are views of other ceramic multi-layer substrates according to the present invention.
Figure 7:
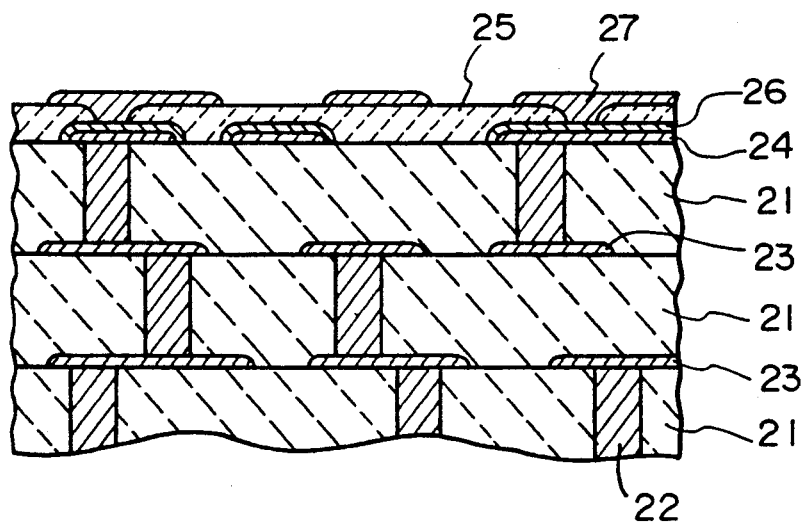

FIGS. 6 and 7 illustrate another embodiment of the present invention.

In this embodiment, referring to FIG. 6, the ceramic multi-layer substrate is made of a laminate of alumina tapes 21 and inner conductor layers 23; the inner conductor layers 23 being electrically connected by filled through holes 22 in the alumina layers 21. A top conductor layer 24 is formed on the top of the laminate and is electrically connected with the inner conductor layers 23, and a thick film glass layer 25 having openings is formed on the top conductor layer 24, and a connection assist layer 26 is formed in the openings thereof. Thereafter thick film conductor layer 27 is formed on the thick film glass layer 25 and the connection assist layer 26. Thus the present invention may be also applied to a ceramic multi-layer substrate having a laminate of alternate ceramic and inner conductor layers.

The steps of manufacturing this embodiment are as shown below.

Green alumina tapes, in which through holes are punched and filled with a refractory metal paste and on which an inner conductor paste layer is formed in a predetermined pattern, are stacked and fired at about 1600° C. in a reducing atmosphere, whereby a fired laminate of alternate alumina tapes 21 and inner conductor layers 23 connected by the filled trough holes 22 is formed, the fired laminate having a top conductor layer 24 at the top thereof.

A thick film glass layer 25 having openings is printed on the top conductor layer 24 and the top alumina layer of the fired laminate, and is fired in a reducing atmosphere. A connection assist layer 26 is then formed on the exposed top conductor layer 24 in the openings, by plating Cu, Ni, Au, etc., or by a thick film forming method of Ni, Pt, Au, etc., and thick film conductor layer 27 is then formed on the connection assist layer 26 and the thick film glass layer 25, by firing in a reducing atmosphere. The thick film conductor layer 27 is electrically connected to the inner conductor layer 24. Further, the thick film conductor layer 27 may be fired in the air, by making the connection assist layer 26 oxidation resistant. If necessary, the steps from the formation of the thick film glass layer 25 to the formation of the thick film conductor layer 27 may be repeated, to form a multi-layer on the fired laminate.

Alternatively, as shown in FIG. 7, after firing the laminate of the alternate alumina tapes 21 and inner conductor layers 23, the connection assist layer 26 may be first formed to cover the top conductor layer 24, followed by forming the thick film glass layer 25 and then the thick film conductor layer 27. In this case, the thick film conductor layer 27 is normally fired in a reducing atmosphere, but may be fired in the air by making the connection assist layer 26 resistant to oxidation. By repeating the steps of forming the thick film glass layer 25 and then the thick film conductor layer 27, a multi-layer may be formed on the fired laminate.

In this structure or process, the thick film glass layer 25 should have a firing temperature lower than the lowest firing temperature of the alumina layers in the laminate, to thereby provide an excellent insulation between the thick film conductor layer 27 and the inner conductor layer 23, even if the alumina tape 21 has a large defect.

In this embodiment of the present invention, since the thickness of the alumina tape is relatively thick, e.g., 200–250 $\mu$m, the insulation between the layers is relatively reliable, but still the persent invention is effective and useful for providing an excellent insulation, even though such a thick tape may sometimes have a critical defect. (Note that the present invention is essentially particularly effective and useful for providing an excellent insulation when the thickness of the ceramic layer is not more than 150 $\mu$m). Further, according to the present invention, at least one more conductor layer, or even a multi-layer structure, may be formed on the fired laminate of the alternate alumina tapes 21 and inner conductor layers 23, thereby providing the following advantages. Namely, in a conventional structure, only one thick film conductor layer (corresponding to the layer 24) is formed on the top of the fired laminate and, therefore, if the circuit is to be changed, molds for punching through holes in alumina green sheet tapes must be changed due to the changes of the location and number of the through holes, which is disadvantageous due to a high cost and long time required for the mold change. In contrast, in the present invention, even if the circuits are changed, the fired laminate may be used without change and the thick film glass and conductor layers formed on the fired laminate modified, which is easy and inexpensive.

Note, the printing method and the tape method may be combined to form a stack.

The present invention is not limited to the above embodiments and can be modified. For example, the ceramic layer may be made of aluminum nitride (AlN), mullite ($3Al_2O_3.2SiO_2$), etc., and further, may be made of a glass ceramic. This is advantageous in that it has a low firing temperature, e.g., 850°–1000° C., and thus a metal having a low melting point, such as Ag, Cu, Ni, Pt, Ag-Pt, etc., may be used in place of a refracory metal such as W or Mo to form an inner conductor layer.

The thick film glass layer 9 or 25 may be formed by placing a glass film or sheet and firing. Also, the material of the insulating layer formed on the laminate may be not only glass but also a glass ceramic composite, etc., but preferably can be fired at a temperature lower than the lowest firing temperature of the ceramic layer in the laminate, so that a re-firing of the ceramic layer in the stack during the firing of the insulating layer is avoided. To prevent pin holes in the insulating layer, the insulating layer is preferably formed from a material having a low viscosity, e.g., lower than 200,000 cps, during the printing step or before firing.

We claim:

1. A process for manufacturing a ceramic multi-layer substrate, comprising the steps of:

forming and firing a laminate of alternate ceramic and inner conductor layers at a first firing temperature lower than a melting point of the inner conductor layers by a thick film-forming method, the laminate having a top ceramic layer;

then forming and firing a glass-containing insulating layer on the top ceramic layer at a second firing temperature lower than said first firing temperature by a thick film-forming method, and forming and firing a conductor layer on the insulating layer by a thick film-forming method; wherein said conductor layer is electrically connected to one of the inner conductor layers, wherein said glass-containing layer is positioned between said conductor layer and one of said inner conductor layers.

2. A process according to claim 1, wherein the top ceramic layer has a thickness of not more than 150 μm.

3. A process according to claim 1, wherein the ceramic layers are formed by a thick film forming method.

4. A process according to claim 1, wherein the insulating layer is formed by a thick film forming method.

5. A process according to claim 1, wherein the insulating layer is formed by forming a plurality of glass layers one on the other.

6. A process according to claim 1, wherein the inner conductor layers are made of a refractory metal.

7. A process according to claim 1, wherein a top conductor layer is formed on the laminate of alternate ceramic and inner conductor layers having a top ceramic layer, the top conductor layer being electrically connected to the inner conductor layers, and said process further comprises the step of forming a connection assist layer on the top conductor layer prior to the forming of the conductor layer, the connection assist layer existing between and electrically connecting the top conductor layer and the conductor layer.

8. A process according to claim 1, wherein the connection assist layer is formed prior to the forming of the insulating layer.

9. A process according to claim 7, wherein the connection assist layer is formed after the forming of the insulating layer.

10. A process according to claim 7, wherein the connection assist layer is resistant to oxidation and the conductor layer is formed on the connection assist layer and is fired in the air.

11. A process according to the claim 1, wherein the steps of the forming the insulating layer and then the conductor layer are repeated, to form a plurality of conductor layers on the laminate.

* * * * *